United States Patent
Otto et al.

(10) Patent No.: US 9,762,245 B1
(45) Date of Patent: Sep. 12, 2017

(54) SEMICONDUCTOR STRUCTURE WITH BACK-GATE SWITCHING

(71) Applicant: GLOBALFOUNDRIES INC., Grand Cayman (KY)

(72) Inventors: Michael Otto, Weinboehla (DE); Nigel Chan, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/182,068

(22) Filed: Jun. 14, 2016

(51) Int. Cl.
*H03K 19/00* (2006.01)
*H03K 19/094* (2006.01)
*H03K 19/0948* (2006.01)
*H03K 19/20* (2006.01)

(52) U.S. Cl.
CPC .... *H03K 19/09429* (2013.01); *H03K 19/09487* (2013.01); *H03K 19/20* (2013.01)

(58) Field of Classification Search
CPC ...... H03K 19/09429; H03K 19/00315; H03K 19/00361; H03K 19/09487
USPC .............................. 326/56–58, 104, 119–120
See application file for complete search history.

(56) References Cited

U.S. PATENT DOCUMENTS

| 5,103,277 A | 4/1992 | Caviglia et al. | |
| 6,107,836 A * | 8/2000 | Kawahara | H03K 3/356113 326/102 |
| 6,118,328 A * | 9/2000 | Morikawa | H03K 19/0016 327/534 |
| 6,937,068 B2 * | 8/2005 | Nakayama | H01L 27/0921 257/E27.063 |
| 7,382,162 B2 * | 6/2008 | Chiang | H03K 19/0948 326/112 |
| 7,679,428 B2 * | 3/2010 | Nozawa | H03K 5/2481 327/534 |
| 7,898,297 B2 * | 3/2011 | Kapoor | H01L 21/823807 326/93 |
| 8,443,306 B1 | 5/2013 | Dhong et al. | |
| 8,988,152 B2 * | 3/2015 | Ohmaru | H01L 27/1225 326/119 |
| 2005/0158929 A1 | 7/2005 | Yamazaki et al. | |
| 2007/0047364 A1 | 3/2007 | Chuang et al. | |

(Continued)

FOREIGN PATENT DOCUMENTS

| EP | 0942535 | 9/1999 |
| EP | 2605407 | 6/2013 |

OTHER PUBLICATIONS

Saha et al., "Implementation of the Cluster Based Tunable Sleep Transistor Cell Power Gating Technique for a 4x4 Multiplier Circuit", International Journal of Computer Applications 66, Feb. 2013, 7 pages.

(Continued)

*Primary Examiner* — Jason M Crawford
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to circuits with logical back-gate switching and methods of operation. The circuit includes at least one front-gate contact and digital back-gate potentials for logical function implementation on a back side of at least one device. The digital back-gate potentials are switchable between two logic levels.

9 Claims, 6 Drawing Sheets

(56) References Cited

U.S. PATENT DOCUMENTS

| | | | | |
|---|---|---|---|---|
| 2007/0262793 A1* | 11/2007 | Kapoor | ............... | H01L 29/8086 |
| | | | | 326/101 |
| 2009/0086528 A1 | 4/2009 | Hanafi | | |
| 2010/0149864 A1 | 6/2010 | Ertosun et al. | | |
| 2012/0307572 A1 | 12/2012 | Yamaoka et al. | | |
| 2014/0340118 A1* | 11/2014 | Ferrant | ................ | H03K 19/094 |
| | | | | 326/57 |
| 2015/0129967 A1* | 5/2015 | Kumar | ................ | H01L 27/1203 |
| | | | | 257/350 |

OTHER PUBLICATIONS

Grenouillet et al., "UTBB FDSOI transistors with dual STI for a multi-Vt strategy at 20nm node and below", IEEE, 2012, 4 pages.

Unknown, "FD-SOI Technology Innovations Extend Moore's Law", A Globalfoundries White Paper, Sep. 2015, 9 pages.

Wang, "Independent-Gate FinFET Circuit Design Methodology", IAENG International Journal of Computer Science, 37:1, IJCS_37_1_06, Feb. 1, 2010, 8 pages.

Rostami et al. "Novel dual-Vth independent-gate FinFET circuits", IEEE, 2010, Retrieved from the Internet on Mar. 6, 2017, 6 pages.

Translation of German Office Action in related DE Application No. 10 2016 214 659.9, dated Mar. 8, 2017, 6 pages.

* cited by examiner

SEMICONDUCTOR STRUCTURE WITH BACK-GATE SWITCHING

FIELD OF THE INVENTION

The present disclosure relates to semiconductor structures and, more particularly, to circuits with logical back-gate switching and methods of operation.

BACKGROUND

Conventional CMOS circuitry utilizes the single gate for all logical function implementation. As the circuit scales up, valuable real estate on the chip is consumed due to additional circuitry needed for the logic functions. For example, in a tri-state buffer, ENABLE and ENABLEN circuitry (including ENABLE and ENABLEN signal lines and respective FETS) are required for each buffer. (See, for example, FIG. 2.) Accordingly, as the amount of tri-state buffers increase on the chip, e.g., n+1, the ENABLE and ENABLEN circuitry also increases by the same amount, n+1. In essence, as each of the tri-state buffers include an additional FET for each ENABLE signal, the increase in chip area usage becomes very large over time.

SUMMARY

In an aspect of the disclosure, a circuit comprises MOS device and at least one front-gate contact and digital back-gate potentials for logical function implementation on a back side of at least one device. The digital back-gate potentials are switchable between two logic levels.

In an aspect of the disclosure, a circuit comprises: a first device having a front-gate control and a logic back-gate control connecting to a contact and for providing logical function to the first device; and a second device having a front-gate control input and a logic back-gate control connecting to the contact and for providing logical function to the second device.

In an aspect of the disclosure, an operation of a logic back-gate control for multiple devices comprises providing a logical low level (Vbg_off) and a logical high level (Vbg_on) to a back-gate of each of the multiple devices.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to circuits with logical back-gate switching and methods of operation. More specifically, the present disclosure provides circuits with logical switching using back-gate circuitry. For example, in embodiments, the circuit can be a complementary metal oxide semiconductor (CMOS) circuit in fully depleted silicon-on-insulator (FD-SOI) technology using digital back-gate potentials for logical function implementation, i.e., the back-gate potential is switched between two levels. In embodiments, the physical back-gate can be shared between multiple devices.

The logical back-gate switching technology described herein can be implemented in many different logical devices, e.g., circuitry, such as a tri-state buffer, NAND and NOR gates, and power gating applications. The logical back-gate switching technology also has additional applications including, but not limited to, e.g., implementation of test logic and setting of system on chip (SoC) configuration after power up including, e.g., setting of trimmings and operational mode and loading redundancy applications.

Advantageously, the logical back-gate switching technology described herein provides a back-gate voltage which inhibits front gate channel control. In addition, the switching of logic devices by the back-gate voltage can be used for power saving and can block level selectivity, as further examples. Moreover, considerable savings in chip area is provided by implementing the logical back-gate switching described herein, as no extra silicon area is needed for additional logical functions. Also, in implemented test logic, there will be a low impact on the data path and the external HV supply will be needed only during the testing of the SOC. Lastly, in implementations of setting of SoC configuration after power up, less devices are needed in the signal path for certain logical functions, thereby avoiding IR drop and delay as with conventional logic.

Figure 1:
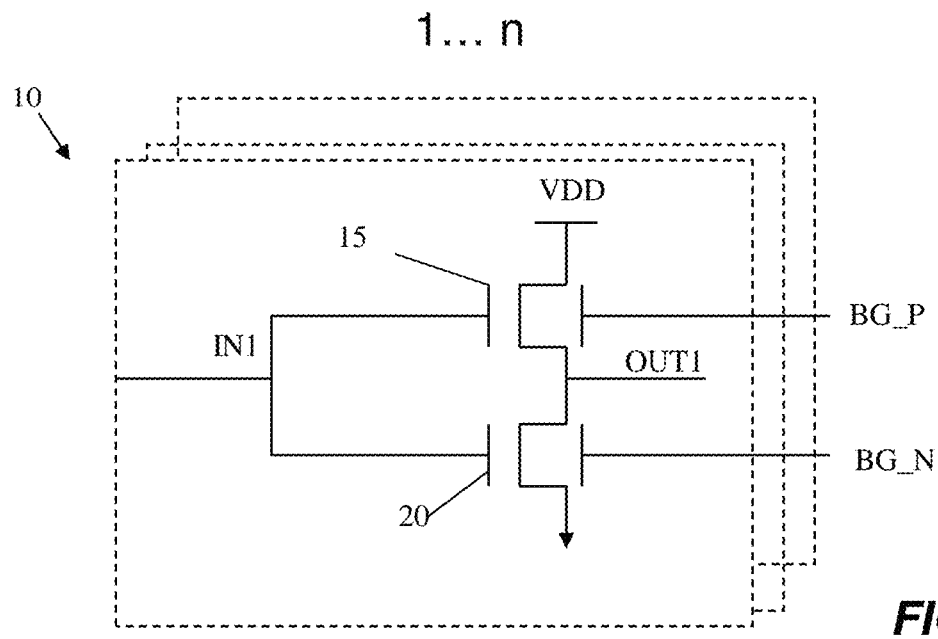
FIG. 1 shows a tri-state buffer for bus with "n" channels using logical back-gate switching in accordance with aspects of the present disclosure.

FIG. 1 shows a tri-state buffer for bus with "n" channels using logical back-gate switching in accordance with aspects of the present disclosure. More specifically, the tri-state buffer 10 can be representative of 1+n devices, each of which include an input, IN1, and an output, OUT1. As should be understood by those of skill in the art, in conventional implementations, the output, OUT1, is an inverted signal of the input, IN1.

Still referring to FIG. 1, the tri-state buffer 10 further includes a PFET device 15 and an NFET device 20. The input, IN1, is connected to a respective gate of the PFET device 15 and the NFET device 20; whereas, back-gate signal lines BG_P and BG_N are connected to the back-gates of the PFET device 15 and the NFET device 20, respectively. A voltage, VDD, can be applied to the source of the PFET device 15 and a voltage, VSS, can be applied to the source of the NFET device 20.

In embodiments, the back-gate signal lines BG_P and BG_N provide logical controls which utilize back-gate switching to each of the devices. More specifically, in embodiments, the back-gate signal lines BG_P and BG_N provide a back-gate potential (voltage), i.e., logic "1" or "0", to the back-gates of the respective PFET device 15 and NFET device 20. By providing a back-gate potential, i.e., logic "1" or "0", the back-gate signal lines BG_P and BG_N can provide additional logic function to the respective devices, e.g., PFET device 15 and NFET device 20. In embodiments, the back-gate potential will also inhibit front gate channel control. In this way, it is possible to control additional device functions from a backside of the device (compared to only front gate channel control).

Figure 2:
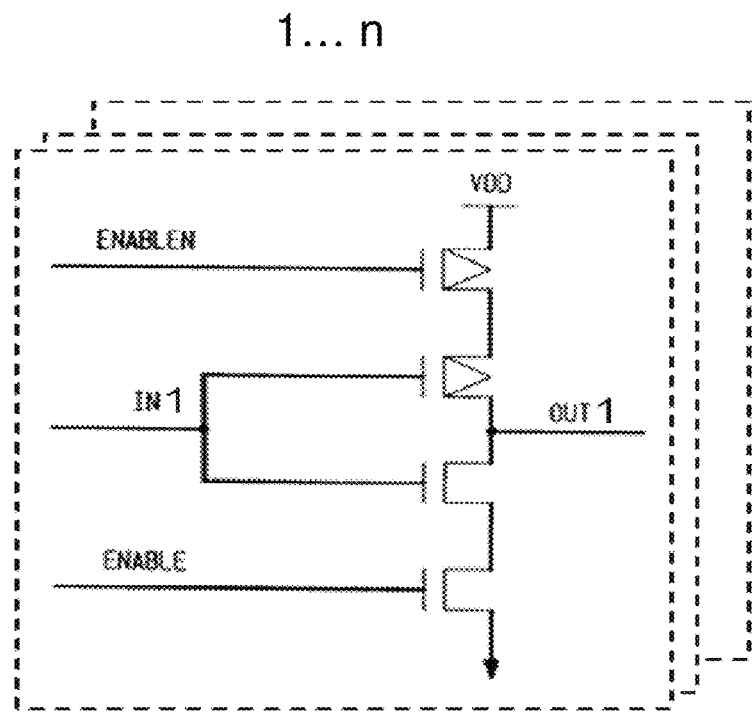
FIG. 2 shows a tri-state buffer for bus with "n" channels using ENABLEN and ENABLE circuitry.

Also, advantageously, by using the back-gate signal lines BG_P and BG_N and its respective logic signals, it is now possible to eliminate the ENABLE and ENABLEN circuitry (including ENABLE and ENABLEN signal lines and respective FETS) used in a conventional tri-state buffer as shown in FIG. 2. This will provide considerable area savings. Similarly, as the tri-state buffer 10 scales up, e.g., n+1 buffers, all back-gate signal lines BG_P and BG_N for each channel can be shared with a single contact (voltage source), providing considerable area savings. This is compared to a conventional tri-state buffer which requires ENABLE and ENABLEN circuitry for each buffer. Also, the back-gate signal lines BG_P and BG_N for each channel share a single contact.

Figure 3:
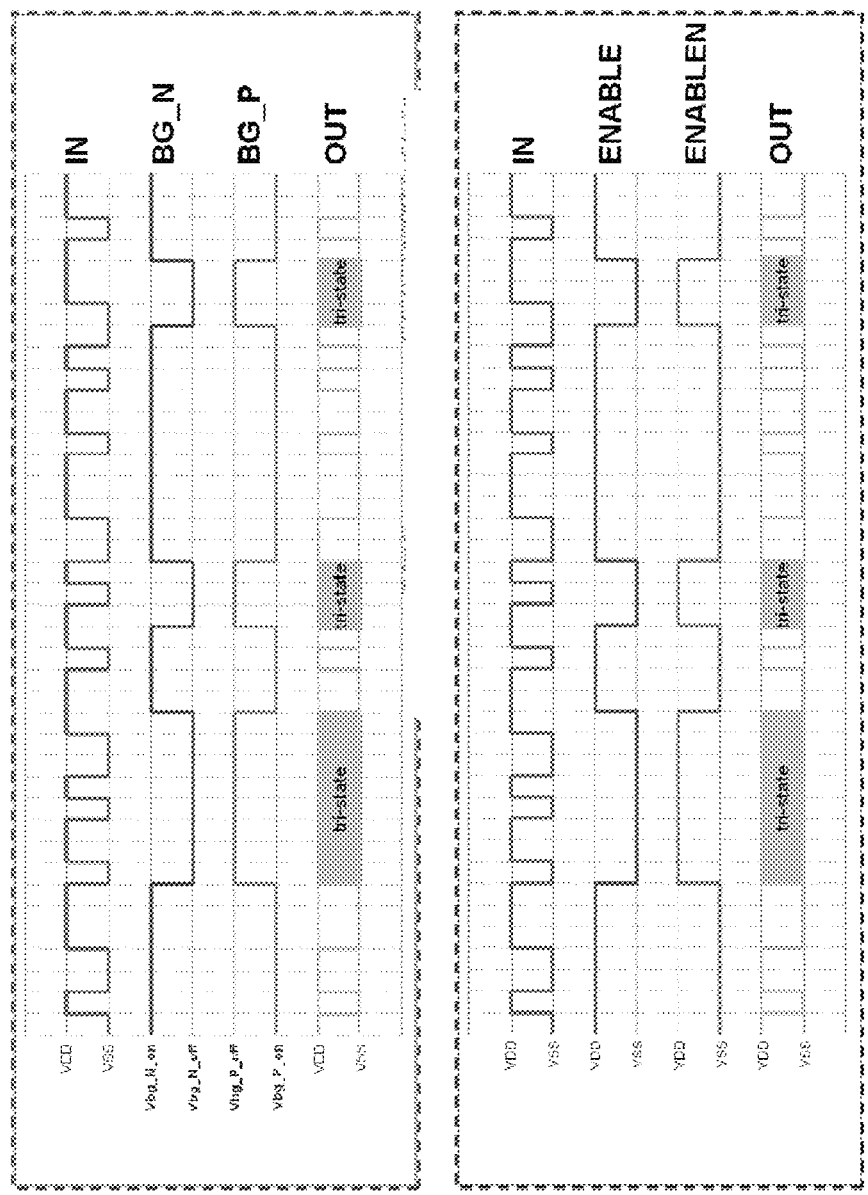
FIG. 3 shows a comparison of tri-state buffer logical switching between the structures of FIGS. 1 and 2.

FIG. 3 shows a comparison of tri-state buffer logical switching of the structures shown in FIGS. 1 and 2. In particular, the switching logic graph "A" shows the tri-state buffer logical switching with a back-gate logic switching shown in FIG. 1. The switching logic graph "B" shows the tri-state buffer logical switching with the ENABLE and ENABLEN circuitry shown in FIG. 2. As can be seen from FIG. 3, the back-gate logic switching shown in FIG. 1 provides additional logic to the tri-state buffer.

Figure 4:
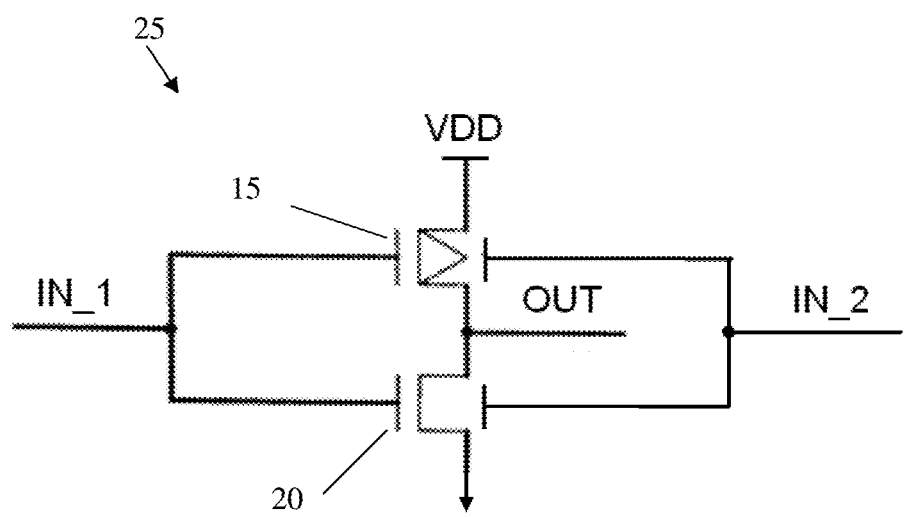
FIG. 4 shows NOR and NAND cell implementations with different switching level using back-gate switching in accordance with aspects of the present disclosure.

FIG. 4 shows NOR and NAND cell implementations with different switching levels using back-gate switching in accordance with aspects of the present disclosure. In particular, the NOR and NAND cell 25 includes an input, IN_1, and an output, OUT. The NOR and NAND cell 25 further includes a PFET device 15 and an NFET device 20. The input, IN_1, is split and connected to a respective front-gate of the PFET device 15 and the NFET device 20; whereas, back-gate signal line IN_2 is split (e.g., tied together) to connect with the back-gates of the PFET device 15 and the NFET device 20, respectively. Also, the back-gate signal line IN_2 has a single contact so it can be shared between multiple devices, e.g., PFET device 15 and the NFET device 20. A voltage, VDD, is applied to the source of the PFET device 15 and a voltage, VSS, can be applied to the source of the NFET device 20.

In embodiments, the back-gate signal line IN_2 provides logical back-gate switching to each of the devices. More specifically, the back-gate signal line IN_2 provides a back-gate potential (voltage), i.e., logic "1" or "0", to the back-gates of respective PFET device 15 and NFET device 20. Similar to that described above with respect to the tri-state buffer, by providing a back-gate potential, i.e., logic "1" or "0", the back-gate signal line IN_2 can provide additional logic function to the respective devices, e.g., PFET device 15 and NFET device 20, as well as inhibit front gate channel control. In this way, it is possible to control additional device functions from a backside of the device (compared to only front gate channel control). Also, advantageously, by using the back-gate signal line IN_2 and its respective logic signals, it is now possible to eliminate devices in conventional NOR or NAND gate applications, e.g., one NFET and one PFET, providing considerable area savings. Also, as in each of the different aspects described herein, as the back-gate signal line (e.g., IN_2) share a single contact, it is possible to share a physical back-gate control between multiple devices, e.g., PFET device 15 and the NFET device 20.

Table 1 shows the logic functions of the NOR gate implementation in accordance with the present disclosure. As shown in Table 1, when IN_2 applies a logic "0" (e.g., 0V) to both devices (e.g., PFET 15 and NFET 20), the devices will have a normal inversion function resulting in an output (OUT) of logic "0" (e.g., 0V) or logic "1" (e.g., 0.8V), depending on the input signal IN_1. More specifically, when IN_1 and IN_2 apply a logic "0" (e.g., 0(0V)) to both devices, the devices will be active and the output (OUT) will have a normal inversion function, e.g., logic "1" (e.g., 0.8V). Similarly, when IN_1 applies a logic "1" (e.g., 0.8V) and IN_2 applies a logic "0" (e.g., 0V), the devices will be active and the output (OUT) will have a normal inversion function, e.g., logic "0" (e.g., 0V). On the other hand, when the IN_2 applies a logic "1", the PFET 15 will be "OFF", the NFET 20 will be "ON", and the front gate channel control will be inhibited (regardless of the logic signal) resulting in an output logic "0", e.g., 0(0V).

TABLE 1

| IN_1 (FG-LV) | IN_2 (BG-HV) | OUT (LV) |
|---|---|---|
| 0 (0 V) | 0 (0 V) | 1 (0.8 V) |
| 1 (0.8 V) | 0 (0 V) | 0 (0 V) |
| 0 (0 V) | 1 (+8 V) | 0 (0 V) |
| 1 (0.8 V) | 1 (+8 V) | 0 (0 V) |

Table 2 shows the logic functions of the NAND gate implementation in accordance with the present disclosure. As shown in Table 2, when IN_2 applies a logic "1" (e.g., 1(0V)), the output of the devices will have a normal inversion function of logic "0" (e.g., 0V) or logic "1" (e.g., 0.8V), depending on the input signal IN_1. On the other hand, when the IN_2 applies a logic "0", e.g., 0(−8V), the NFET 20 is "OFF", the PFET is "ON" and the front gate channel control will be inhibited (regardless of the logic signal) resulting in an output logic "1", e.g., 0(0.8V).

TABLE 2

| IN_1 (FG-LV) | IN_2 (BG-HV) | OUT (LV) |
|---|---|---|
| 0 (0 V) | 0 (−8 V) | 1 (0.8 V) |
| 1 (0.8 V) | 0 (−8 V) | 1 (0.8 V) |
| 0 (0 V) | 1 (0 V) | 1 (0.8 V) |
| 1 (0.8 V) | 1 (0 V) | 0 (0 V) |

Figure 5:
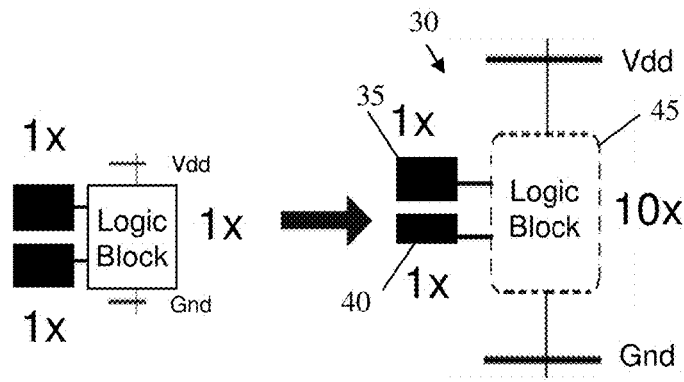
FIG. 5 shows power gating logic using back-gate switching in accordance with aspects of the present disclosure.
Figure 6:
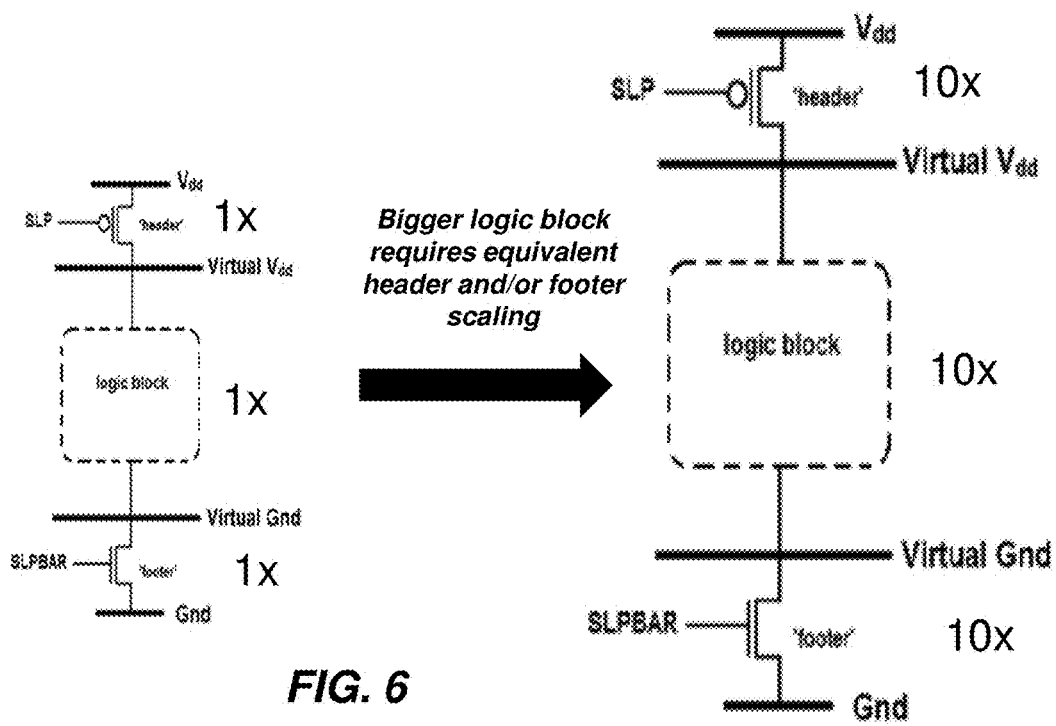
FIG. 6 shows power gating logic using header and footer circuitry.

FIG. 5 shows power gating logic using back-gate switching in accordance with aspects of the present disclosure. In this implementation of the power gating logic 30, a single PFET back-gate control 35 and a single NFET back-gate control 40 can be used to provide back-gate logic signals to a single logic block 40 comprising one or more PFET and NFET devices. In embodiments, the single PFET back-gate control 35 and the single NFET back-gate control 40 can sit in a single well (e.g., have a single contact). Accordingly, in this implementation, regardless of the scaling of the logic block 40, no additional scaling of circuits for back-gate control would be required for providing the logical back-gate switching to each of the devices. For example, compared to conventional power gating logic, which requires header circuitry and footer circuitry for bigger logic block implementations as shown representatively in FIG. 6, the power gating logic 30 can be implemented with a single well (e.g., have a single contact) using the single control for the PFET back-gate control 35 and the single NFET back-gate control 40, regardless of the size of the logic block 40.

Also, due to the elimination of the header circuitry and footer circuitry required to operate (e.g., isolate) the logic block, it is also possible to provide a significant reduction in power savings. This is especially advantageous as the header circuitry and footer circuitry becomes larger as the logic block scales up, thus requiring even additional power (e.g., current).

Figure 7:
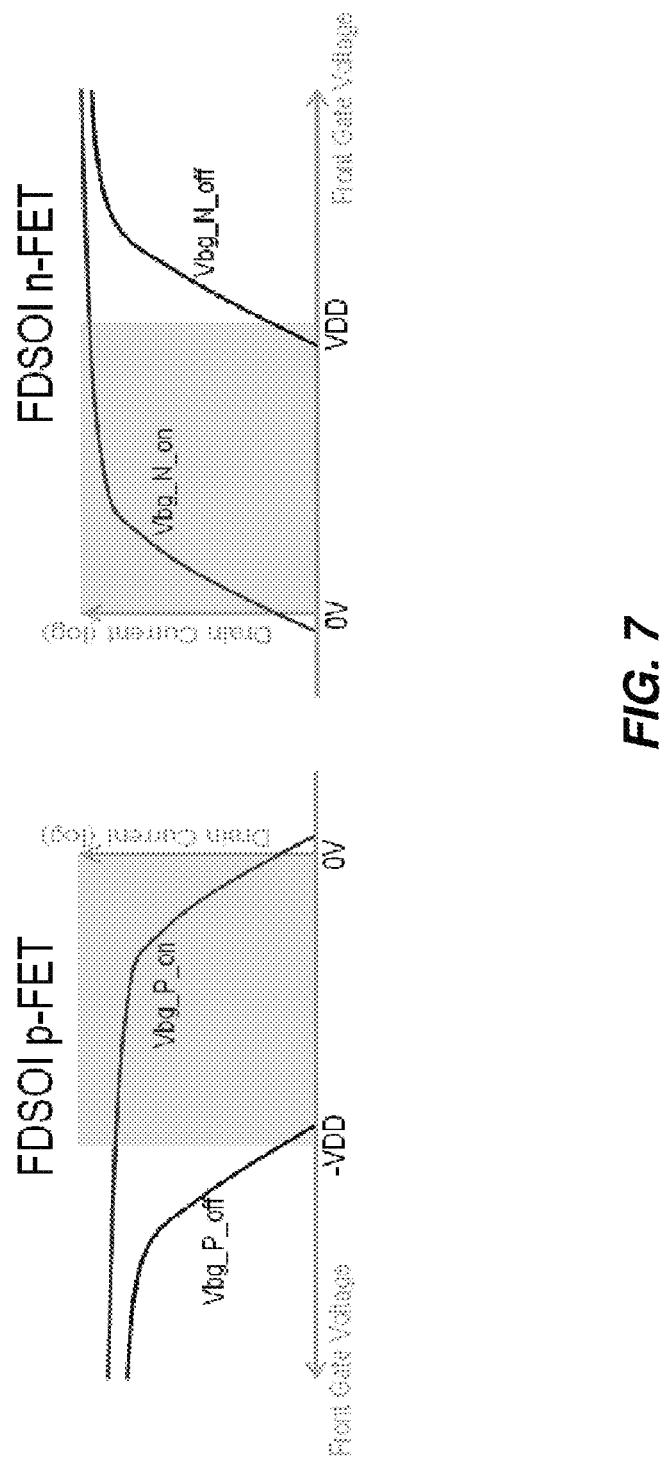
FIG. 7 graphically shows operations of the different devices using back-gate switching in accordance with aspects of the present disclosure.

FIG. 7 graphically shows operations of the different devices using back-gate switching in accordance with aspects of the present disclosure. More specifically, FIG. 7 graphically shows the operation of FDSOI PFET and NFET devices. For example, in addition to the logical high level (VDD) and logical low level (GND) which is applied to the front gate, an additional logical low level (Vbg_off) and logical high level (Vbg_on) are shown applied to the back-gate of the devices. As described herein, in embodiments, Vbg_on and Vbg_off may be applied separately or concurrently for NFET and PFET devices. The logical levels applied to the back-gate are such that:

(i) when Vbg_on is applied, the logical high and logical low applied to the front gate are sufficient to switch the device between a conductive state (ON) and non-conductive state (OFF); and (ii) when Vbg_off is applied, a logical high and logical low applied to the device have no impact on the state of the device.

Figure 8:
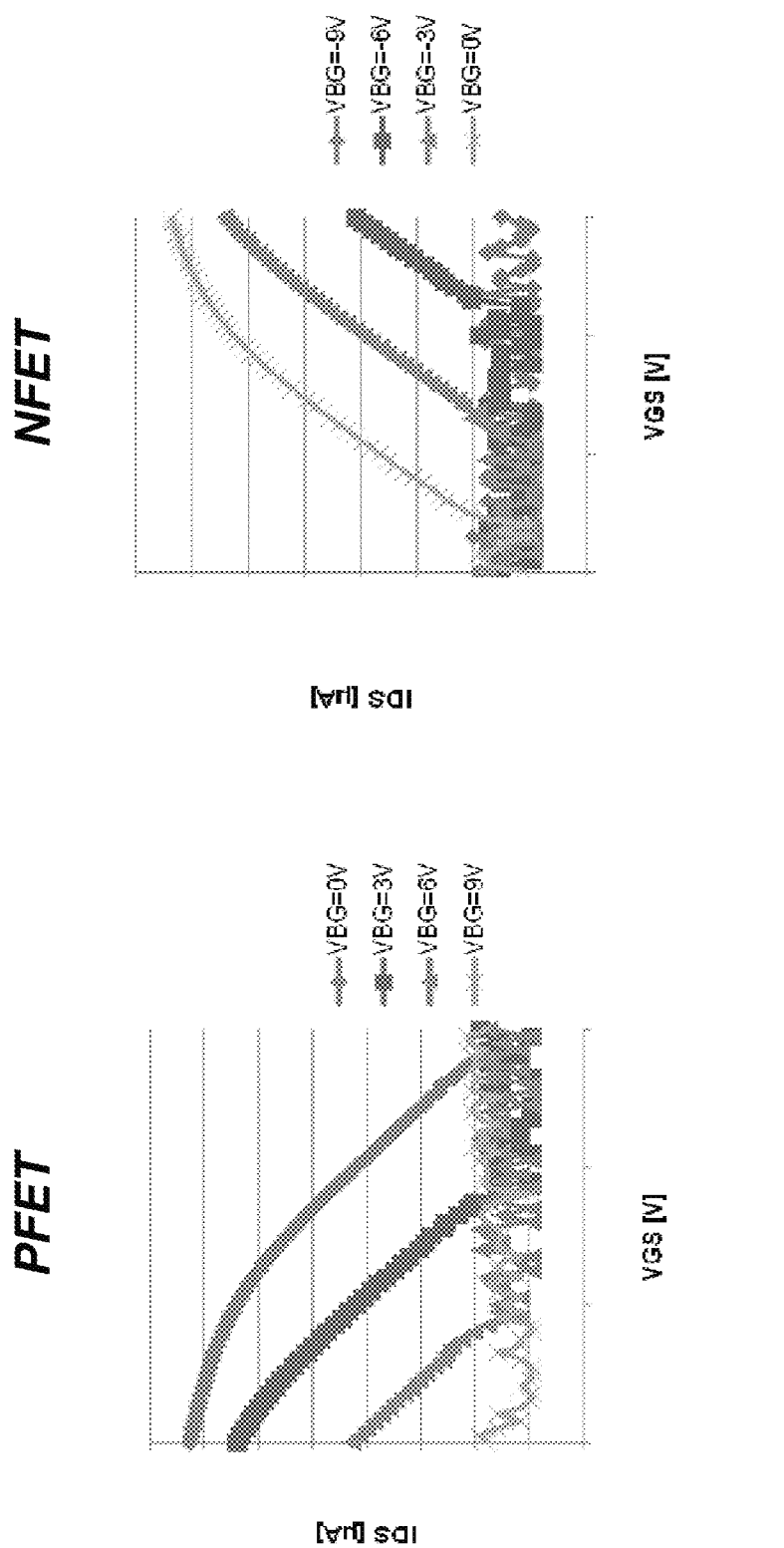
FIG. 8 shows a single device back-gate response measurement for NFET and PFET devices.

FIG. 8 shows a single device back-gate response measurement for NFET and PFET devices. As shown in FIG. 8, the devices are functional up to 9V back-gate bias. In the NFET implementation, the NFET is turned "ON" at VGB=0V and the NFET is turned "OFF" at VGB=−9V. In contrast, in the PFET implementation, the PFET is turned "ON" at VGB=0V and the PFET is turned "OFF" at VGB=9V.

The circuits of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the circuits are built on wafers and are realized in films of material patterned by photolithographic processes on the top of a wafer. In particular, the fabrication of the circuits uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A circuit comprising a plurality of pairs of MOS devices, each pair comprised of a first MOS device and a second MOS device, wherein each pair of MOS devices is coupled to at least one front-gate contact and two digital back-gate potentials each of which are separately connected to a single device of the first MOS device and the second MOS device, wherein each of the two digital back gate potentials provide separate logical function implementation on a back side of its corresponding single device, by each being switchable between two logic levels, and wherein the digital back-gate potentials for the logical function implementation include a first common contact connected to each first MOS device of the plurality of pairs of MOS devices and a second common contact connected to each second MOS device of the plurality of pairs of MOS devices such that each of the first MOS devices shares a physical back-gate control with other first MOS devices and each of the second MOS devices shares a physical back-gate control with other second MOS devices.

2. The circuit of claim 1, wherein the multiple devices include an NFET device and a PFET device.

3. The circuit of claim 1, wherein the multiple devices form one of a tri-state buffer, a NAND or NOR gate, a logic block and power gating logic.

4. The circuit of claim 1, wherein the two logic levels include a logical low level (Vbg_off) and a logical high level (Vbg_on) which are applied separately or concurrently to a back-gate of the at least one device.

5. The circuit of claim 4, wherein:
when the Vbg_on is applied, the logical high level and logical low level applied to a front gate are sufficient to switch the at least one device between a conductive state and non-conductive state; and
when the Vbg_off is applied, the logical high level and the logical low level applied to the at least one device have no impact on a state of the at least one device.

6. The circuit of claim 1, wherein one of the digital back-gate potentials inhibit front gate control of the at least one front-gate contact.

7. The circuit of claim 1, wherein the at least one device is implemented in a complementary metal oxide semiconductor (CMOS) circuit in fully depleted silicon-on-insulator (FDSOI) technology.

8. An operation of a logic back-gate control for separately controlling multiple devices, comprising each logic-back gate control for the multiple devices providing a logical low level (Vbg_off) and a logical high level (Vbg_on) to a back-gate of each of the multiple devices, wherein the multiple devices comprise a plurality of pairs of MOS devices, each pair comprised of a first MOS device and a second MOS device, and wherein the logic-back gate control providing a logical low level (Vbg_off) and a logical high level (Vbg_on) to a back-gate of each of the multiple devices includes a first common contact connected to each first MOS device of the plurality of pairs of MOS devices and a second common contact connected to each second MOS device of the plurality of pairs of MOS devices such that each of the first MOS devices shares a physical back-gate control with other first MOS devices and each of the second MOS devices shares a physical back-gate control with other second MOS devices.

9. The circuit of claim 8, wherein:
  when the Vbg_on is applied, the logical high level and logical low level applied to a front gate are sufficient to switch each of the multiple devices between a conductive state and non-conductive state; and
  when the Vbg_off is applied, the logical high level and the logical low level applied to each of the multiple devices have no impact on a state of each of the multiple devices.

* * * * *